(12) United States Patent
Kim

(10) Patent No.: US 7,825,584 B2
(45) Date of Patent: Nov. 2, 2010

(54) ORGANIC LIGHT EMITTING DISPLAY DEVICE AND METHOD FOR FABRICATING THE SAME

(75) Inventor: Byung Hee Kim, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 38 days.

(21) Appl. No.: 11/503,168

(22) Filed: Aug. 14, 2006

(65) Prior Publication Data

US 2007/0046185 A1 Mar. 1, 2007

(30) Foreign Application Priority Data

Aug. 26, 2005 (KR) .................. 10-2005-0079063

(51) Int. Cl.
*H01J 1/62* (2006.01)
*H01J 63/04* (2006.01)

(52) U.S. Cl. ............. 313/504; 313/506; 313/498; 445/24

(58) Field of Classification Search ............ 313/504, 313/506, 498; 445/24
See application file for complete search history.

(56) References Cited

U.S. PATENT DOCUMENTS

| | | | |
|---|---|---|---|
| 6,366,025 B1 | 4/2002 | Yamada | |
| 6,429,599 B1 * | 8/2002 | Yokoyama | ............... 315/169.3 |
| 6,838,819 B2 | 1/2005 | Kim et al. | |
| 2004/0036421 A1 * | 2/2004 | Arnold et al. | ............ 315/169.3 |
| 2004/0048101 A1 * | 3/2004 | Thompson et al. | .......... 428/690 |

FOREIGN PATENT DOCUMENTS

| | | |
|---|---|---|
| JP | H08-213172 | 8/1996 |
| JP | H10-074582 | 3/1998 |
| JP | 2002-124381 | 4/2002 |

(Continued)

OTHER PUBLICATIONS

Korean Office Action for Korean Patent Application No. 2005-0079063 issued on Oct. 12, 2006.

(Continued)

*Primary Examiner*—Nimeshkumar D Patel
*Assistant Examiner*—Thomas A Hollweg
(74) *Attorney, Agent, or Firm*—Robert E. Bushnell, Esq.

(57) ABSTRACT

In an organic light emitting display and a method for fabricating the same, a layout of respective pixels is changed in order to improve life span so that one pixel region having low luminous efficiency is increased. The organic light emitting display includes at least one pixel comprising sub pixels having a plurality of colors. A first sub pixel emission layer is formed over an entire surface of a pixel region. At least two second sub pixel emission layers are formed at the first sub pixel emission layer so as to have a closed curve. The layout of respective pixels is changed so as to increase an area of one sub pixel region having low luminous efficiency in order to improve the life span and aperture ratio of the organic light emitting display. In addition, during formation of an emission layer, the number of masks is reduced. Accordingly, the possibility of misalignment is reduced, thereby maximizing resolution, improving yield, and reducing manufacturing cost.

33 Claims, 6 Drawing Sheets

FOREIGN PATENT DOCUMENTS

| | | |
|---|---|---|
| JP | 2003-208988 | 7/2003 |
| JP | 2004-111082 | 4/2004 |
| JP | 2005-100939 | 4/2005 |
| KR | 10-2004-0075043 | 7/2003 |
| KR | 10-2004-0017786 | 2/2004 |
| KR | 10-2005-0052473 | 2/2004 |
| KR | 10-2005-0027467 | 3/2005 |
| KR | 10-2005-0048348 | 5/2005 |
| WO | 2005-056716 | 6/2005 |

OTHER PUBLICATIONS

Transmittal Letter along with Japanese Office action dated May 19, 2009 in Applicant's corresponding Japanese Patent Application No. 2005-326468.

* cited by examiner

ORGANIC LIGHT EMITTING DISPLAY DEVICE AND METHOD FOR FABRICATING THE SAME

CLAIM OF PRIORITY

This application makes reference to, incorporate the same herein, and claims all benefits accruing under 35 U.S.C. §119 from an application for ORGANIC LIGHT EMITTING DISPLAY AND METHOD FOR FABRICATING THE SAME earlier filed in the Korean Intellectual Property Office on 26 Aug. 2005 and there duly assigned Serial No. 10-2005-0079063.

BACKGROUND OF THE INVENTION

1. Technical Field

The present invention relates to an organic light emitting display and a method for fabricating the same. More particularly, the present invention relates to an organic light emitting display and a method for fabricating the same, wherein a layout of respective pixels is changed in order to improve life duration so that one pixel region having low luminous efficiency is increased.

2. Related Art

Recently, various flat plate displays capable of reducing weight and volume, which are disadvantages of cathode ray tubes (CRT), have been developed. Flat panel displays include liquid crystal displays (LCD), field emission displays (FED), plasma display panels (PDP), and organic light emitting displays (OLED).

In particular, since light emitting displays have greater use temperature range, higher resistance to shock or vibration, a wider angle of visibility, and a higher-speed response in comparison with other flat plate displays, they have been proposed as the next generation of planar type display devices.

Such light emitting displays include an organic light emitting display using an organic light emitting diode and an inorganic light emitting display using an inorganic light emitting diode. The organic light emitting diode includes an anode electrode, a cathode electrode, and an organic emission layer disposed between the anode electrode and the cathode electrode for emitting light by means of a combination of electrons and holes. The inorganic light emitting diode includes an inorganic light emitting layer composed of a PN junction semiconductor.

In the organic light emitting display, red (R), green (G), and blue (B) materials are deposited at sub pixel regions formed in at least one pixel region on a substrate, and the respective sub pixel regions emit light by driving a thin film transistor formed on the substrate. The reason why red (R), green (G), and blue (B) sub pixel regions are respectively disposed at different locations is to embody a full color display when lights from three primary colors are integrated by a human being's eyes, so that the lights recognize various colors based only on the three primary colors.

Prior displays have been burdened by several disadvantages. Specifically, since there are limits to the fabrication of a sub pixel region of a certain color, it is difficult to make displays having improved life span. In response to this problem, a laser thermal transfer method has been proposed, but this method is characterized by the disadvantages of the high cost of laser equipment, and the difficulty of improving the quality of a transfer layer.

In some prior displays, different sub pixels must be patterned using different masks by colors. However, in this case, there is a problem of misalignment, and the resolution of the display deteriorates as a result. In addition, manufacturing cost increases and a more precise patterning technique is required.

SUMMARY OF THE INVENTION

Accordingly, it is an object of the present invention to provide an organic light emitting display and a method for fabricating the same, wherein a layout of respective pixels is changed in order to improve life span so that one pixel region having low luminous efficiency is increased.

It is another object of the present invention to provide an organic light emitting display and a method for fabricating the same, wherein the number of masks for forming an emission layer is reduced.

The foregoing and/or other aspects of the present invention are achieved by providing an organic light emitting display comprising at least one pixel including sub pixels having a plurality of colors, the display comprising: a first sub pixel emission layer formed over an entire surface of a pixel region; and at least two second sub pixel emission layers formed at the first sub pixel emission layer so as to have a closed curve.

Preferably, the first sub pixel emission layer is formed so as to have a blue color. In addition, a forming area of the first sub pixel emission layer, except forming areas of the at least two second sub pixel emission layers, is greater than that of each of the at least two second sub pixel emission layers. More preferably, the organic light emitting display further comprises an electron blocking layer formed over the entire surface of the pixel region between the first sub pixel emission layer and the at least two second sub pixel emission layers.

According to another aspect of the present invention, an organic light emitting display comprises at least one pixel including sub pixels having a plurality of colors, and further comprises: at least two first sub pixel emission layers formed on a pixel region so as not to overlap each other; and a second sub pixel emission layer formed on the at least two first sub pixel emission layers and over an entire surface of the pixel region so as to include the at least two first sub pixel emission layers.

Preferably, the second sub pixel emission layer is formed so as to have a blue color. In addition, a forming area of the second sub pixel emission layer, except forming areas of the at least two first sub pixel emission layers, is greater than that of each of the at least two first sub pixel emission layers. More preferably, the organic light emitting display further comprises a hole blocking layer formed over the entire surface of the pixel region between the at least two first sub pixel emission layers and the second sub pixel emission layer.

According to a further aspect of the present invention, an organic light emitting display comprises at least one pixel including sub pixels having a plurality of colors, and further comprises: first electrode layers respectively included in the sub pixels and formed on one region of a substrate; a first sub pixel emission layer formed over an entire surface of a pixel region; a second sub pixel emission layer formed at one region of the first sub pixel emission layer so as to have a closed curve; a third sub pixel emission layer formed at another region of the first sub pixel emission layer so as to have a closed curve; and second electrode layers formed at the first, second, and third sub pixel emission layers, respectively.

Preferably, the first sub pixel emission layer is formed so as to have a blue color. In addition, a forming area of the first sub pixel emission layer, except forming areas of the second and third sub pixel emission layers, is greater than that of each of the second and third sub pixel emission layers.

More preferably, the organic light emitting display further comprises an electron blocking layer formed over the entire surface of the pixel region between the first and second sub pixel emission layers, and the electron blocking layer is formed of Ir(ppz)$_3$.

Most preferably, the luminous efficiency of the first sub pixel emission layer is lower than that of each of the second and third sub pixel emission layers, a ratio of the area of the second sub pixel emission layer to the area of the first sub pixel emission layer ranges from 0.2 to 0.5, and a ratio of the area of the third sub pixel emission layer to the area of the first sub pixel emission layer ranges from 0.2 to 0.5. In this embodiment, the second and third sub pixel emission layers are formed so as to have red and green colors, respectively, the first, second and third sub pixel emission layers are arranged in a stripe pattern, and the first, second and third sub pixel emission layers are arranged in a delta pattern.

According to an additional aspect of the present invention, an organic light emitting display comprises at least one pixel including sub pixels having a plurality of colors, the at least one pixel comprising: first electrode layers respectively included in the sub pixels and formed on one region of a substrate; a first sub pixel emission layer formed on one region of a pixel region on the first electrode; a second sub pixel emission layer formed on another region of the pixel region on the first electrode; a third sub pixel emission layer formed over an entire surface of the pixel region so as to include the first and second sub pixel emission layers on the first and second sub pixel emission layers; and second electrode layers formed at the first, second, and third sub pixel emission layers, respectively.

Preferably, the third sub pixel emission layer is formed so as to have a blue color, and a forming area of the third sub pixel emission layer, except forming areas of the first and second sub pixel emission layers, is greater than that of each of the first and second sub pixel emission layers.

More preferably, the organic light emitting display further comprises a hole blocking layer formed over the entire surface of the pixel region between the first and third sub pixel emission layers, and a hole blocking layer formed over the entire surface of the pixel region between the second and third sub pixel emission layers. Most preferably, the hole blocking layer is made of one material selected from the group consisting of BCP, BAlq, SAlq, TAZ, OXD7, Alq$_3$, and PBD.

In this embodiment, luminous efficiency of the third sub pixel emission layer is lower than that of each of the first and second sub pixel emission layers, a ratio of the area of the first sub pixel emission layer to the area of the third sub pixel emission layer ranges from 0.2 to 0.5, and a ratio of the area of the second sub pixel emission layer to the area of the third sub pixel emission layer ranges from 0.2 to 0.5. Also, the first and second sub pixel emission layers are formed so as to have red and green colors, respectively, the first, second and third sub pixel emission layers are arranged in a stripe pattern, and the first, second and third sub pixel emission layers are arranged in a delta pattern. In addition, pixel definition films are respectively formed along peripheral regions of the first and second sub pixel emission layers.

According to a further aspect of the present invention, in a method for fabricating an organic light emitting display comprising at least one pixel including sub pixels having a plurality of colors, a method of forming a region of the pixel comprises the steps of: forming first electrode layers of the sub pixels on one region of a substrate; forming a first sub pixel emission layer over an entire surface of the pixel region; forming a second sub pixel emission layer on one region of the first sub pixel emission layer so as to have a closed curve; forming a third sub pixel emission layer on another region of the first sub pixel emission layer so as to have a closed curve; and forming second electrode layers on the first and second sub pixel emission layers, respectively.

Preferably, the first sub pixel emission layer is formed by vacuum deposition, wet coating, ink jet, or a thermal transfer method. More preferably, the first and second sub pixel emission layers are formed by vacuum deposition, wet coating, ink jet, or a thermal transfer method. Most preferably, the method further comprises forming a hole blocking layer over the entire surface of the pixel region between the first and second sub pixel emission layers. In this embodiment, the first and third sub pixel emission layers are formed by vacuum deposition, wet coating, ink jet, or a thermal transfer method.

According to another aspect of the present invention, in a method for fabricating an organic light emitting display comprising at least one pixel including sub pixels having a plurality of colors, a method of forming a region of the pixel comprises the steps of: forming first electrode layers of the sub pixels on one region of a substrate; forming a first sub pixel emission layer at one region of the pixel region so as to be disposed on the first electrode layer; forming a second sub pixel emission layer at another region of the pixel region so as to be disposed on the first electrode layer; forming a third sub pixel emission layer over an entire surface of the pixel region, including the first and second sub pixel emission layers, so as to be disposed between the first and second sub pixel emission layers; and forming second electrode layers on the first, second and third sub pixel emission layers, respectively.

Preferably, the third sub pixel emission layer is formed by vacuum deposition, wet coating, ink jet or a thermal transfer method. More preferably, the first and second sub pixel emission layers are formed by vacuum deposition, wet coating, ink jet or a thermal transfer method. Most preferably, the method further comprises forming a hole blocking layer over the entire surface of the pixel region between the first and third sub pixel emission layers. In this embodiment, the hole blocking layer is formed by vacuum deposition, wet coating, ink jet, or a thermal transfer method.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
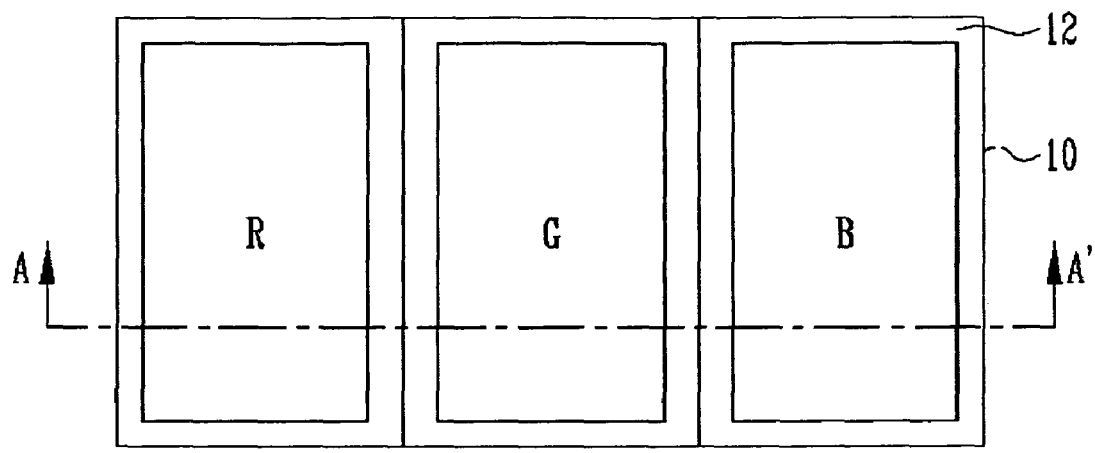
FIG. 1 is a layout schematically showing a one pixel region.

Hereinafter, an organic light emitting display and a method for fabricating the same according to preferable embodiments of the present invention will be described with reference to the accompanying drawings. When one element is connected to another element, one element may be not only directly connected to another element but also indirectly connected to another element via a third element. Further, irrelevant elements are omitted for clarity. Also, like reference numerals refer to like elements throughout.

FIG. 1 is a layout schematically showing a one-pixel region.

With reference to FIG. 1, a pixel region 10 includes red (R), green (G) and blue (B) sub pixel regions. The red (R), green (G) and blue (B) sub pixel regions have the same area in a strip pattern. The red (R), green (G) and blue (B) sub pixel regions are divided by pixel definition films 12 formed between the red (R), green (G) and blue (B) sub pixel regions.

According to a sub pixel arrangement of another organic light emitting display, red (R), green (G) and blue (B) sub pixel regions are arranged at a pixel region in a delta pattern. As described above, when the red (R), green (G) and blue (B) sub pixel regions are formed in the stripe or delta pattern, the red (R), green (G) and blue (B) sub pixel regions may be formed so as to have different areas in such a way that the pixel regions are patterned and deposited by red (R), green (G) and blue (B) sub pixel regions. However, because there is a limit to fabrication of a sub pixel region of a specific color to meet a request for a current organic light emitting display, it is difficult to improve the life span of the organic light emitting display.

In order to solve the aforementioned problem, a laser thermal transfer method capable of providing a minute patterning and transferring an emission layer has been proposed. However, the laser thermal transfer method has problems in that laser equipment is expensive, and it is difficult to improve the quality of a transfer layer.

Figure 2:
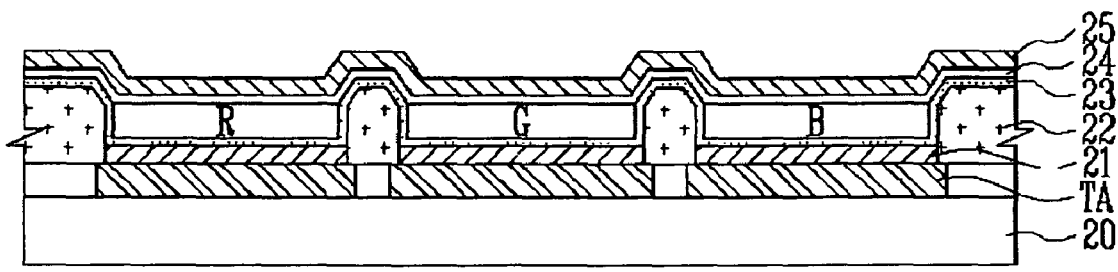
FIG. 2 is a cross-sectional view of the one pixel region taken along line A-A' of FIG. 1.

FIG. 2 is a cross-sectional view of the one-pixel region taken along line A-A' of FIG. 1.

Referring to FIG. 2, the organic light emitting display includes a transistor array TA, a first electrode layer 21, a hole transport layer 23, red (R), green (G) and blue (B) sub pixels, an electron transport layer 24, and a second electrode layer 25. The transistor array TA is formed on a substrate 20. The first electrode layer 21 is formed on the transistor array TA. The hole transport layer 23 is formed over an entire surface of a pixel region on the first electrode layer 21. The red (R), green (G) and blue (B) sub pixels are formed on the hole transport layer 23 so as not to be overlapped with each other by a pixel definition film 22. The electron transport layer 24 is formed over an entire surface of the substrate 20 on the red (R) green (G) and blue (B) sub pixels. The second electrode layer 25 is formed on the electron transport layer 24.

As mentioned above, the red (R), green (G) and blue (B) sub pixels are patterned and formed using a shadow mask or a fine metal mask (FMM).

However, when the organic light emitting display forms an emission layer, the red (R), green (G), and blue (B) sub pixels should be patterned using different masks by colors. Since different masks by colors of the sub pixels should be used, there is a substantial possibility that a misalignment will occur, and the resolution of the organic light emitting display will deteriorate due to the occurrence of the misalignment. Furthermore, because different masks by colors of the emission layer are used, manufacturing cost is increased and a more precise patterning technique is required.

Figure 3:
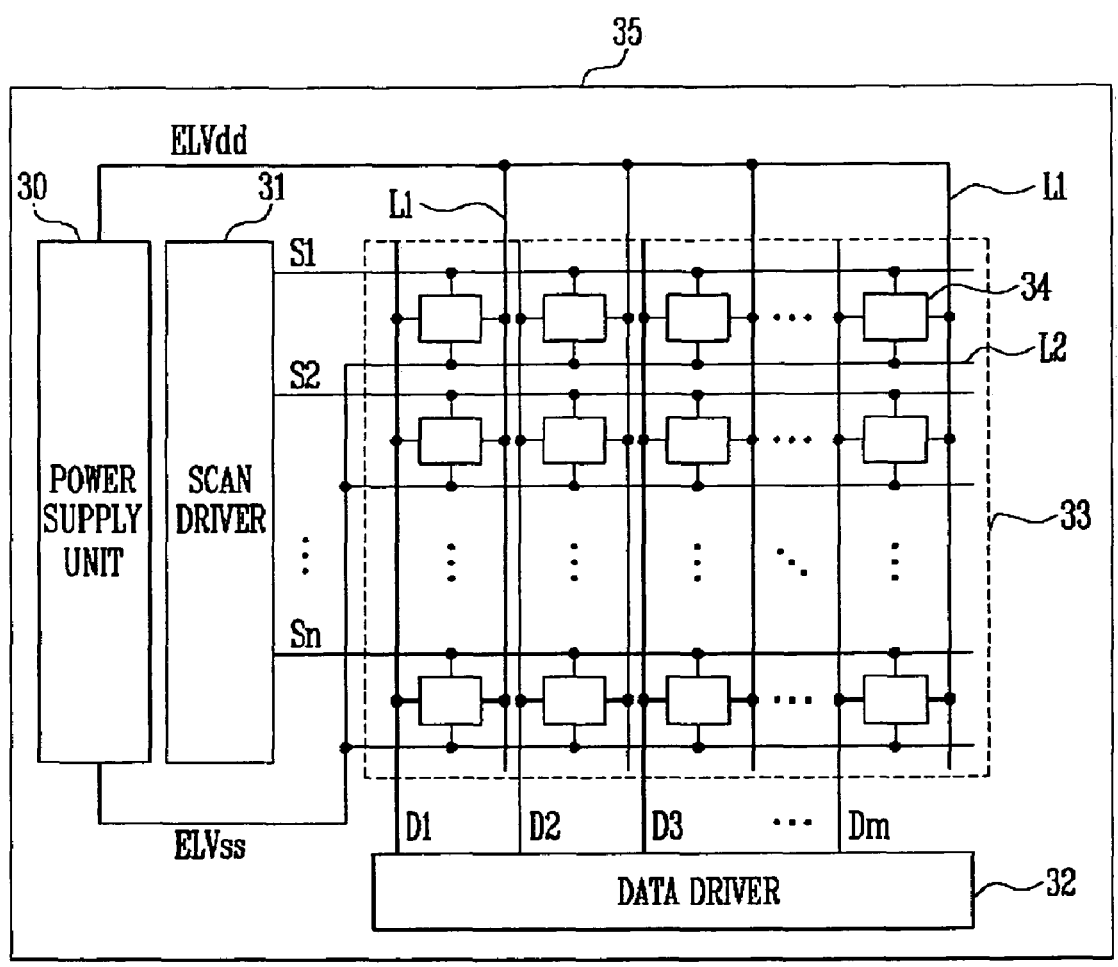
FIG. 3 is a view showing an organic light emitting display according to the present invention.

FIG. 3 is a view showing an organic light emitting display according to the present invention.

With reference to FIG. 3, in the organic light emitting display of the present invention a power supply unit 30 generates and provides to substrate 35 voltages necessary to drive the substrate 35, namely, a drive power supply ELVdd, a ground power supply ELVss, and power necessary to drive a data driver 32 and a scan driver 31.

In the aforementioned organic light emitting display, the scan driver 31 controls a selection signal to drive an organic light emitting diode (not shown) included in each of pixel regions 34, and provides the controlled selection signal to scan lines S1 to Sn. The selection signal is transferred to a switch (not shown) in each pixel region 34 which allows the switch to be turned on/off.

The data driver 32 controls a data voltage or a data current indicating an image signal of each pixel region 34, and provides the controlled data voltage or current to respective data lines D1 to Dm.

A pixel portion 33 includes a plurality of scan lines S1 to Sn, a plurality of data lines D1 to Dm, and a plurality of pixel regions 34. The plurality of scan lines S1 to Sn extend from the scan driver 31 in a transverse direction. The plurality of data lines D1 to Dm extend from the data driver 32 in a longitudinal direction. Red (R), green (G) and blue (B) sub pixel regions are included in each pixel region 34. Each of the pixel regions 34 is formed at a region defined by the plurality of scan lines S1 to Sn and the plurality of data lines D1 to Dm. Each pixel region 34 emits light of an organic light emitting diode according to a scan signal and a data signal so as to display an image.

Figure 4:
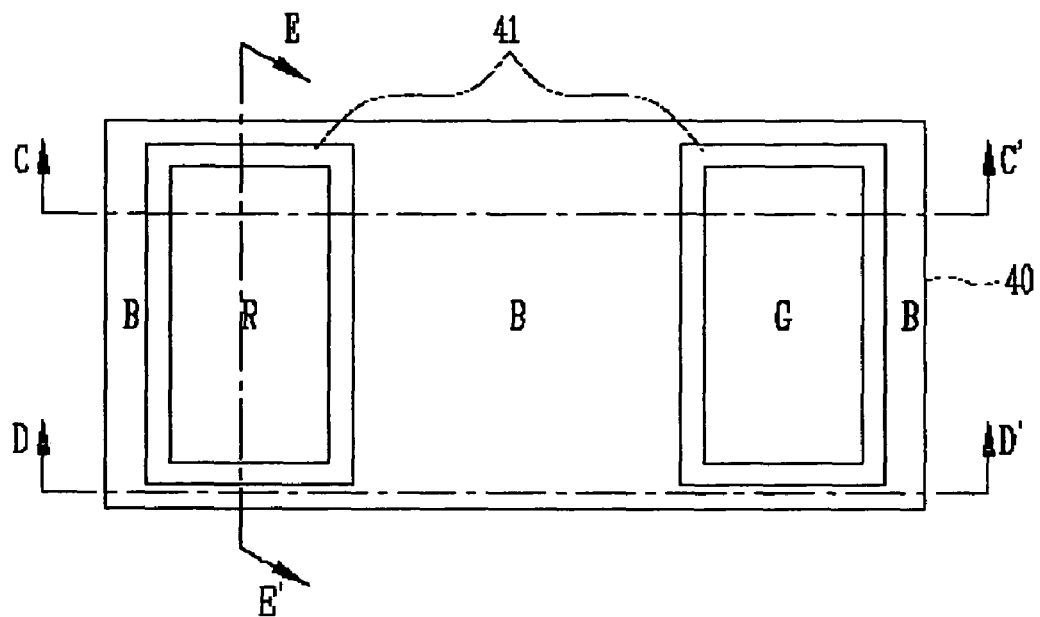
FIG. 4 is a plan view of the one pixel region shown in FIG. 3 as a layout of the organic light emitting display according to a first embodiment of the present invention.

FIG. 4 is a plan view of one pixel region shown in FIG. 3 as a layout of the organic light emitting display according to a first embodiment of the present invention.

Referring to FIG. 4, one pixel region 40 includes red (R), green (G) and blue (B) sub pixel regions. The red (R), green (G) and blue (B) sub pixel regions have areas different from each other. In particular, the blue (B) sub pixel region having relatively lower luminous efficiency is formed over an entire surface of the pixel region 40 in common. The red (R) and green (G) sub pixel regions are formed at a closed curve of the blue (B) sub pixel region so as not to overlap each other. In detail, the red (R) and green (G) sub pixel regions are formed in a stripe pattern with the blue (B) sub pixel region disposed therebetween. Furthermore, the blue (B) sub pixel region is always disposed at a peripheral portion of the pixel region 40.

A forming area of the blue (B) sub pixel, except forming areas of the red (R) and green (G) sub pixels, is greater than that of each of the red (R) and green (G) pixels. In detail, a ratio of the area of the red (R) sub pixel to the area of the blue (B) sub pixel ranges from 0.2 to 0.5, and a ratio of the area of the green (G) sub pixel to the area of the blue (B) sub pixel ranges from 0.2 to 0.5.

Accordingly, the blue (B) sub pixel is formed over an entire surface of a pixel region in common so as to improve luminous efficiency of the blue (B) sub pixel having low luminous efficiency to a level similar to that of each of the red (R) and green (G) sub pixels, thereby improving the life span of the organic light emitting display according to the present invention.

Figure 5:
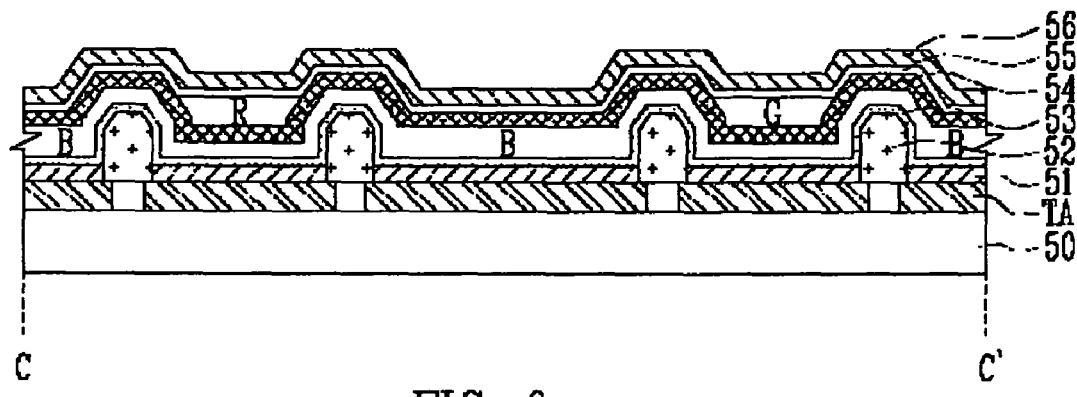
FIG. 5 is a cross-sectional view of the one pixel region taken along one side of line C-C' of FIG. 4.

FIG. 5 is a cross-sectional view of the one pixel region taken along one side of line C-C' of FIG. 4.

Referring to FIG. 5, a transistor array TA and an organic light emitting diode are sequentially formed on a substrate 50. Although not described in detail in the drawings, in the construction of the transistor array TA, a buffer layer is formed on the substrate 50, a semiconductor layer includes an LDD layer formed between an active channel layer and an ohmic contact layer on one region of the buffer layer. A gate insulation film and a gate electrode are sequentially patterned and formed on the semiconductor layer. An interlayer insulation film is formed on the gate electrode so as to expose the ohmic contact layer among the semiconductor layer. A source electrode and a drain electrode are formed at one region of the interlayer insulation film to contact with the exposed ohmic contact layer.

Furthermore, a patterning film is formed on the interlayer insulation film. A via hole is formed so as to etch one region of the patterning film and expose the drain electrode. The drain electrode and a first electrode layer 51 are electrically connected to each other through the via hole. The first electrode layer 51 is formed at one region of the patterning film. A pixel definition film 52 is formed on the patterning film in which an opening portion, at least partially exposing the first electrode layer 51, is formed.

Moreover, a hole transport layer 53 is formed at the pixel definition film 52 and over an entire surface of the opening portion. In order to easily inject holes from the electrode layer 51, the hole transport layer 53 should have a small ionization potential and excellent interface adhesive force with the first electrode layer 51, but should be scarcely absorbed in a visibly ray region. The hole transport layer 53 is made up of a low molecular weight of aryl amine, a low molecular weight of hydrazones, a low molecular weight of stylbene, a low molecular weight of star bursts as NPB, TPD, s-TAD, MTA-DATTA, a high molecular weight of carbalzol, aryl amine system high molecule, high molecular weight of perylenes and pyrolles, or PVK. As described above, hole transport materials may easily transport holes and maintain electrons in only a light emitting region, thereby increasing the formation probability of an excitor.

A blue (B) emission layer having relatively lower luminous efficiency is formed over an entire surface of the pixel region on the hole transport layer 53. An electron blocking layer 54 is formed on the blue (B) emission layer. The electron blocking layer 54 is formed of Ir(ppz)$_3$. A red (R) emission layer is formed on one region of the blue (B) emission layer so as to have a closed curve, and a green (G) emission layer is formed on another region of the blue (B) emission layer.

An electron transport layer 55 is formed over an entire surface of the pixel region on the red (R) and green (G) emission layers. The electron transport layer 55 functions to easily transport electrons from the second electrode layer 56 to the emission layers. The electron transport layer 55 also functions to control the transportation of holes that have not combined with the emission layers in order to increase recombination in the emission layers. Materials having excellent electron affinity, and materials having excellent interface adhesive force with the second electron layer are widely used as the electron transport layer 55.

In addition to Alq3 having excellent electron affinity, PBD, spiro-PBD, oligothiophene, perfluorinated oligo-p-phenylen, or 2,5-diarylsilole derivative is used as the electron transport layer 55.

A second electrode layer 56 is formed on the electron transport layer 55. When the second electrode layer 56 is a top-emitting layer, it is formed of a transparent ITO or IZO. In contrast to this, when the second electrode layer 56 is a rear-emitting layer, it is made of a metal film which is a reflection film.

In addition, although not shown in the drawings, a hole injection layer (not shown) may be further formed over an entire surface of the pixel region between the first electrode layer 51 and the hole transport layer 53. An electron injection layer (not shown) may be further formed over an entire surface of the pixel region between the second electrode layer 56 and the electron transport layer 55.

A method of fabricating an organic light emitting display of the present invention according to one side of a line C-C' in FIG. 4 will now be explained. A transistor array TA is formed on a substrate 50. Next, a first electrode layer 51 is formed on the transistor array TA. When the first electrode layer 51 is a top-emitting layer, it is formed of transparent ITO or IZO. In contrast to this, when the first electrode layer 51 is a rear-emitting layer, it is made of a metal film that is a reflection film.

Thereafter, a blue (B) emission layer having the lowest luminous efficiency is formed over an entire surface of the pixel portion on the first electrode layer 55. The blue (B) emission layer is formed by vacuum deposition, wet coating, ink jet, or a thermal transfer method.

The vacuum deposition is most used among methods for fabricating thin films, and a process thereof is performed by a simple principle. In the vacuum deposition, a metal, a chemical compound or an alloy is heated under vacuum conditions and is evaporated from a melting state. Evaporated particles are deposited on a surface of a substrate. The vacuum deposition is different from a sputtering method in that an evaporation process is a heat exchange process. A thin film made by the vacuum deposition is referred to as 'vacuum deposition thin film'. The vacuum deposition has advantages in that equipment is rather simple, and the vacuum deposition is easily applicable to various materials.

The wet coating coats a target using internal liquid materials, coating materials, and coating solvents. After the coating process, a process for removing solvents is necessarily required. Spray coating, spin coating and deposition coating are examples of wet coating. Accordingly, during a removal of the solvents, since deposition materials may be changed or solvents may remain in the deposition materials, the removal of the solvents should be carefully performed.

In the ink jet method, a head is filled with a solution having an electro-luminescence (EL) material, such as a high molecule organic EL material. In a state wherein the head filled with the solution is arranged away from a substrate by a predetermined distance, the solution from the head is injected into the substrate at high speed, thereby forming an emission layer. The ink jet method has advantages in that the emission layer may be selectively laminated at different regions, and consumption of forming materials of the emission layer may be minimized.

Moreover, the laser thermal transfer method irradiates a laser beam so as to transfer an emission layer by heat generated from light-heat conversion layer of a donor film. The laser thermal transfer method is profitable for the manufacture of a device having a large area. Since it does not need masks, minute patterning and uniformity of a thin film can be improved.

Next, an electron blocking layer 54 is formed over an entire surface of the pixel portion on the blue (B) emission layer. In the same way as the blue (B) emission layer, the electron blocking layer 54 is formed by vacuum deposition, wet coating, ink jet, or a thermal transfer method.

The present invention is not limited to materials for respective emission layers. However, after the blue (B) emission layer is formed as a common layer, in order to form the red (R) and green (G) emission layers, in a case of a fluorescent light emitting diode using fluorescent emission materials as the emission layer, the emission layer is formed and then a hold transport layer is introduced. However, in the case of phosphorescent light emitting diode using emission materials as the emission layer, an electron blocking layer having a Highest Occupied Molecular Orbital (HOMO) greater than that of the emission layer is always needed.

Thereafter, a red (R) emission layer is formed on the electron blocking layer 54 so as to have a closed curve in the blue (B) emission layer, and a green (G) emission layer is formed thereon so as to have a closed curve in another region of the blue (B) emission layer. The blue (B) emission layer is formed by vacuum deposition, wet coating, ink jet, or a thermal transfer method.

Figure 6:
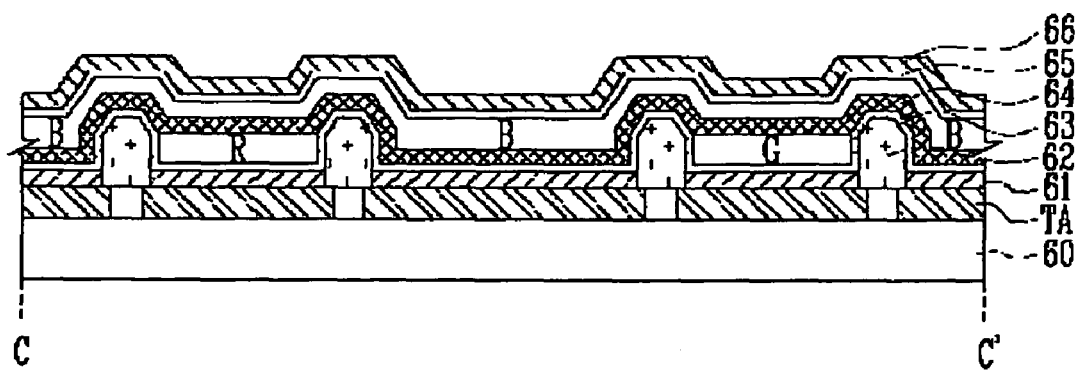
FIG. 6 is a cross-sectional view of the one pixel region of FIG. 4 taken along another side of the line C-C'.

FIG. 6 is a cross-sectional view of the one pixel region of FIG. 4 taken along another side of the line C-C'.

Referring to FIG. 6, a transistor array TA and a light emitting diode are sequentially formed on a substrate 60. A drain electrode of the transistor array TA and a first electrode layer 61 are electrically connected to each other. A pixel definition film 62 is formed on the first electrode layer 61. An opening portion is formed at the pixel definition film 62, and partially exposes the first electrode layer 61.

A hole transport layer 63 is formed on the pixel definition film 62 and the opening portion. In order to easily inject holes from the electrode layer 61, the hole transport layer 63 should have a small ionization potential and excellent interface adhesive force with the first electrode layer 61, but be scarcely absorbed in a visibly ray region. The hole transport layer 63 is formed of low molecular weight of aryl amine, low molecular weight of hydrazones, low molecular weight of stylbene, low molecular weight of star bursts as NPB, TPD, s-TAD, MTA-DATTA, high molecular weight of carbalzol, aryl amine system high molecule, high molecular weight of perylenes and pyrolles, or PVK. As described above, hole transport materials may easily transport holes and maintain electrons in only a light emitting region, thereby increasing the formation probability of an exciter.

A blue (B) emission layer and a green (G) emission are formed on the hole transport layer 63 so as not to overlap each other. The blue (B) emission layer having relative lower luminous efficiency is formed over an entire surface of the pixel portion so as to include the red (R) and green (G) emission layers. A hole blocking layer 64 is formed over an entire surface of the pixel region between red (R) and blue (B) emission layers, and between the green (G) and blue (B) emission layers. The hole blocking layer 64 is formed of BCP, BAlq, SAlq, TAZ, OXD7, Alq3, or PBD.

A blue (B) emission layer is formed over an entire surface of the pixel region on the hole blocking layer 64. An electron transport layer 65 is formed on the blue (B) emission layer. The electron transport layer 65 functions to easily transport electrons from the second electrode layer 66 to the emission layers. The electron transport layer 65 also functions to control the transportation of holes that have not combined with the emission layers in order to increase recombination in the emission layers. Materials having excellent electron affinity and materials having excellent interface adhesive force with the second electron layer are widely used as the electron transport layer 65.

In addition to Alq3 having excellent electron affinity, PBD, spiro-PBD, oligothiophene, perfluorinated oligo-p-phenylen, or 2,5-diarylsilole derivative is used as the electron transport layer 65.

A second electrode layer 66 is formed on the electron transport layer 65. When the second electrode layer 66 is a top-emitting layer, it is formed of a transparent ITO or IZO. In contrast to this, when the second electrode layer 66 is a rear-emitting layer, it is made of a metal film that is a reflection film.

In addition, although not shown in the drawings, a hole injection layer (not shown) may be further formed over an entire surface of the pixel region between the first electrode layer 61 and the hole transport layer 63. An electron injection layer (not shown) may be further formed over an entire surface of the pixel region between the second electrode layer 66 and the electron transport layer 65.

A method for fabricating an organic light emitting display of the present invention according to another side of a line C-C' in FIG. 4 will be now explained. A transistor array TA is formed on a substrate 60. Next, a first electrode layer 61 is formed on the transistor array TA. When the first electrode layer 61 is a top-emitting layer, it is formed of transparent ITO or IZO. In contrast to this, when the first electrode layer 61 is a rear-emitting layer, it is made of a metal film that is a reflection film.

Thereafter, red (R) and green (G) emission layers are formed on a first electrode layer 61. The red (R) and green (G) emission layers are formed by vacuum deposition, wet coating, ink jet, or a thermal transfer method so as not to overlap each other. Since such methods has been described previously, a description thereof is omitted.

Next, a hole blocking layer 64 is formed over an entire surface of the pixel region on the red (R) and (G) emission layers. Then, a blue (B) emission layer is formed over an entire surface of the pixel region on the hole blocking layer 64. The hole blocking layer 64 and the blue (B) emission layer are formed by vacuum deposition, wet coating, ink jet, or a thermal transfer method. Finally, a second electrode layer 66 is formed on the blue (B) emission layer.

The present invention is not limited to materials for respective emission layers. However, after the blue (B) emission layer is formed as a common layer, in order to form the red (R) and green (G) emission layers, in the case of a fluorescent light emitting diode using fluorescent emission materials as the emission layer, the emission layer is formed and then a hold transport layer is introduced. However, in the case of phosphorescent light emitting diode using emission materials as the emission layer, an electron blocking layer having an HOMO greater than that of the emission layer is always needed.

The blue (B) and green (G) emission layers are divided from each other by a pixel definition film 62 formed along boundaries of corresponding sub pixel regions.

In order to assist in an understanding of the present invention, irrelevant elements are omitted for clarity. In particular, detailed descriptions of the construction of a substrate, the functions of layers, and materials are omitted.

Figure 7:
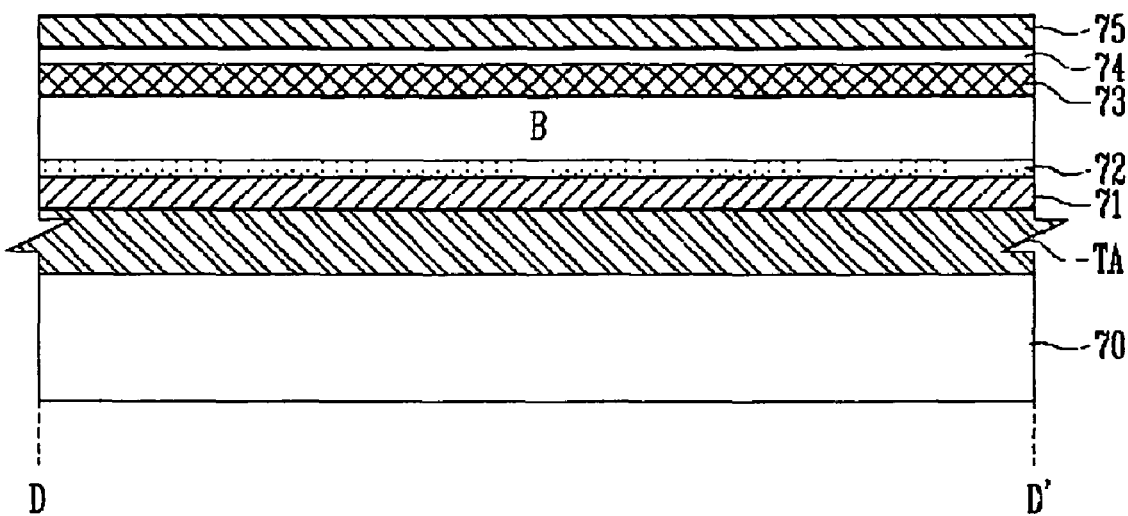
FIG. 7 is a cross-sectional view of the one pixel region of FIG. 4 taken along one side of line D-D'.

FIG. 7 is a cross-sectional view of the one pixel region of FIG. 4 taken along one side of line D-D'.

As shown in FIG. 7, a transistor array TA is formed on a substrate 70, and a first electrode layer 71 is formed on the transistor array TA. A hole transport layer 72 is formed on the first electrode layer 71, and a blue (B) emission layer having the lowest luminous efficiency is formed over an entire surface of the hole transport layer 72.

The red (R) and green (G) emission layers are not shown in FIG. 7. A forming area of the blue (B) emission layer, except a forming area of the red (R) or (G) emission layer, is greater than that of the red (R) or (G) emission layer. A ratio of the area of the red (R) emission layer to the area of the blue (B) emission layer ranges from 0.2 to 0.5, and a ratio of the area of the green (G) emission layer to the area of the blue (B) emission layer ranges from 0.2 to 0.5.

An electron blocking layer 73 is formed on the blue (B) emission layer, and an electron transport layer 74 is formed on the electron blocking layer 73. Furthermore, a second electrode layer 75 is formed on the electron transport layer 74.

Figure 8:
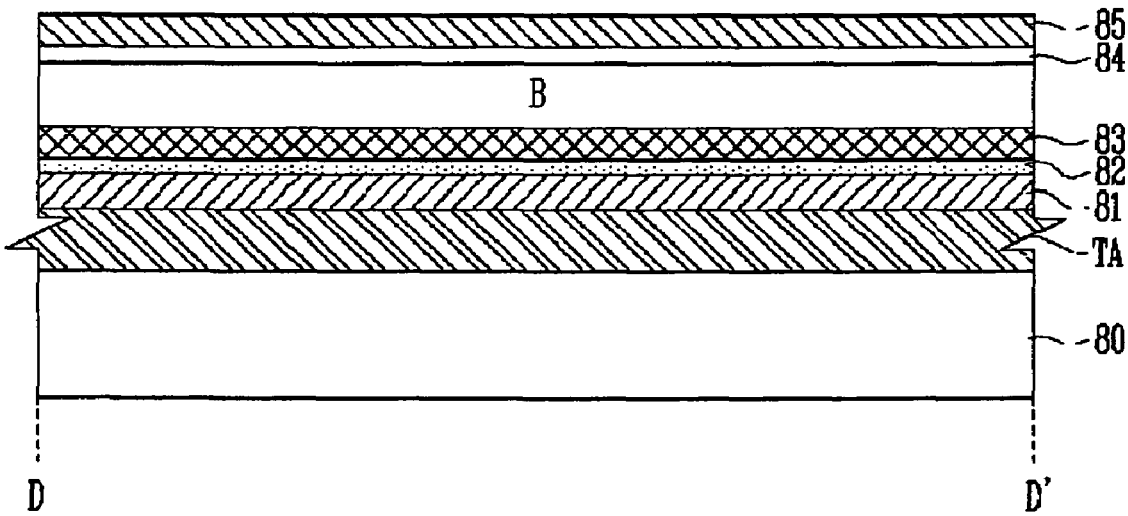
FIG. 8 is a cross-sectional view of the one pixel region of FIG. 4 taken along another side of the line D-D'.

FIG. 8 is a cross-sectional view of the one pixel region of FIG. 4 taken along another side of the line D-D'.

As shown in FIG. 8, a transistor array TA is formed on a substrate 80, and a first electrode layer 81 is formed on the transistor array TA. A hole transport layer 82 is formed on the first electrode layer 81, and a hole blocking layer 83 is formed on the hole transport layer 82. Furthermore, a blue (B) emission layer having the lowest luminous efficiency is formed over an entire surface of the hole blocking layer 83.

The red (R) and green (G) emission layers are shown in FIG. 8. A forming area of the blue (B) emission layer, except a forming area of the red (R) or (G) emission layer, is greater than that of the red (R) or (G) emission layer. A ratio of the area of the red (R) emission layer to the area of the blue (B) emission layer ranges from 0.2 to 0.5, and a ratio of the area of the green (G) emission layer to the area of the blue (B) emission layer ranges from 0.2 to 0.5.

An electron transport layer 84 is formed on the blue (B) emission layer, and a second electrode layer 85 is formed on the electron transport layer 84.

In order to assist in an understanding of the present invention, irrelevant elements are omitted for clarity. In particular, detailed descriptions of the construction of a substrate, the functions of layers, and materials are omitted.

Figure 9:
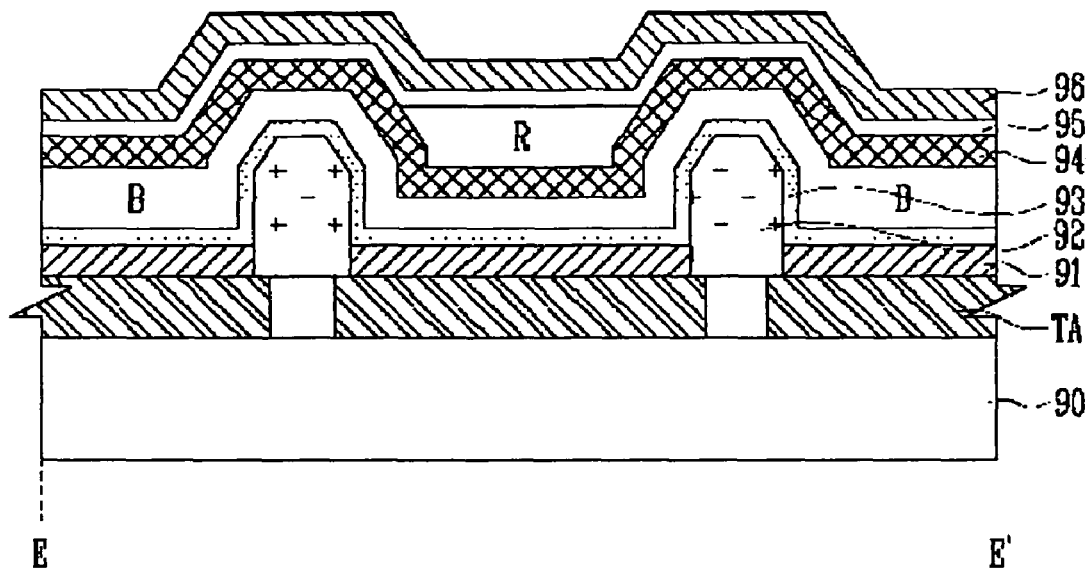
FIG. 9 is a cross-sectional view of the one pixel region of FIG. 4 taken along one side of line E-E'.

FIG. 9 is a cross-sectional view of the one pixel region of FIG. 4 taken along one side of line E-E'.

As shown in FIG. 9, a transistor array TA is formed on a substrate 90, and a first electrode layer 91 is formed on the transistor array TA. A hole transport layer 93 is formed over an entire surface of a pixel region or pixel definition film 92 on the first electrode layer 91, and a blue (B) emission layer having the lowest luminous efficiency is formed over an entire surface of the hole transport layer 93.

Furthermore, an electron blocking layer 94 is formed on the blue (B) emission layer, and a red (R) emission layer is formed at one region on the electron blocking layer 94. An electron transport layer 95 is formed over an entire surface of the pixel region on the red (R) emission layer and the electron blocking layer 94. Additionally, a second electrode layer 96 is formed on the electron transport layer 95.

Figure 10:
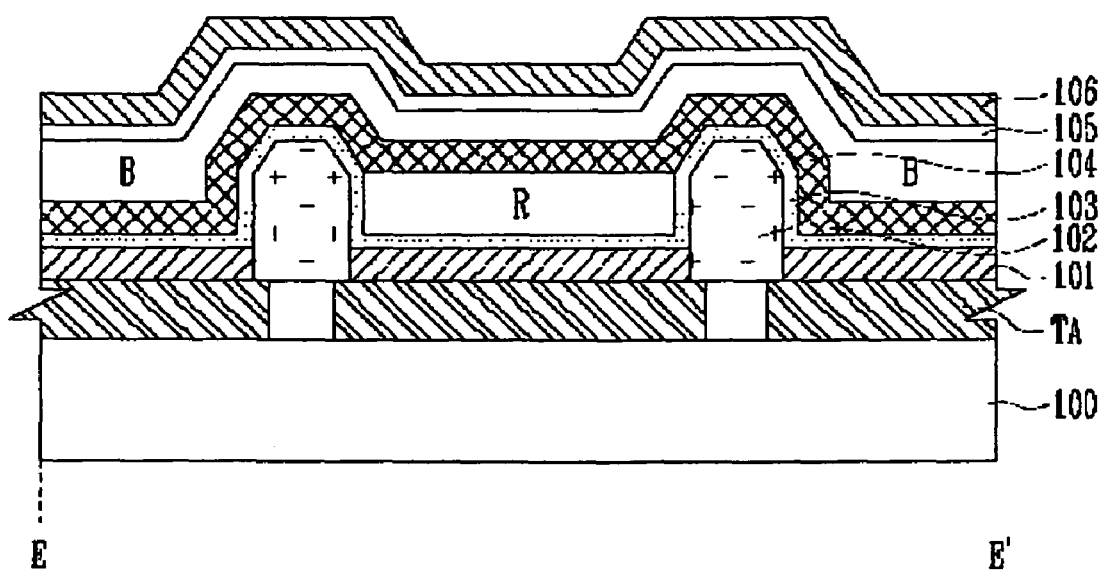
FIG. 10 is a cross-sectional view of the one pixel region of FIG. 4 taken along another side of the line E-E'.

FIG. 10 is a cross-sectional view of the one pixel region of FIG. 4 taken along another side of line E-E'.

As shown in FIG. 10, a transistor array TA is formed on a substrate 100, and a first electrode layer 101 is formed on the transistor array TA. A hole transport layer 103 is formed over an entire surface of a pixel region or pixel definition film 102 on the first electrode layer 101, and a red (R) emission layer is formed at one region of the hole transport layer 103. A hole blocking layer 104 is formed over an entire surface of the pixel region on the red (R) emission layer and the hole transport layer 103. Furthermore, a blue (B) emission layer having the lowest luminous efficiency is formed over an entire surface of the hole blocking layer 104.

An electron transport layer 105 is formed over the entire surface of the pixel region on the blue (B) emission layer, and a second electrode layer 106 is formed on the electron transport layer 105.

Figure 11:
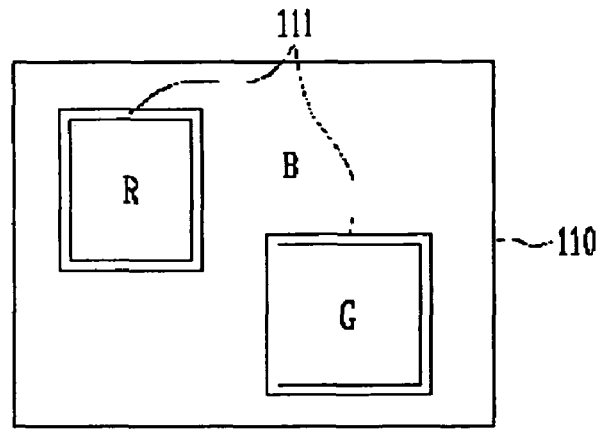
FIG. 11 is a plan view of the one pixel region shown in FIG. 3 as a layout of the organic light emitting display according to a second embodiment of the present invention.

FIG. 11 is a plan view of the one pixel region shown in FIG. 3 as a layout of the organic light emitting display according to a second embodiment of the present invention.

Referring to FIG. 11, one pixel region 110 includes red (R), green (G), and blue (B) sub pixel regions. The red (R), green (G) and blue (B) sub pixel regions have different areas from each other. In particular, the blue (B) sub pixel region having relatively lower luminous efficiency is formed over an entire surface of the pixel region 110 in common. The red (R) and green (G) sub pixel regions are formed in a blue (B) closed curve so as not to overlap each other. The red (R) sub pixel region is formed at an upper left portion of the pixel region 110, whereas the green (G) sub pixel region is formed at a lower right portion of the pixel region 110. The red (R), green (G) and blue (B) sub pixels are arranged in a delta pattern having a triangular shape. Each of the red (R), green (G) and blue (B) sub pixel regions has a square shape, and the blue (B) sub pixel region is formed at a peripheral portion of the pixel region 110.

The blue (B) sub pixel formed on the pixel region 110 may be formed at an upper portion or a lower portion of the red (R) and green (G) sub pixels. When the blue (B) sub pixel is formed at the upper portion thereof, the red (R) and green (G) sub pixel regions are divided from each other by a pixel definition film 111.

Figure 12:
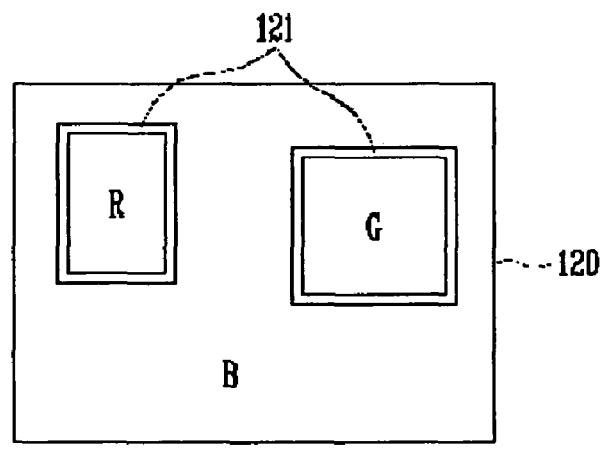
FIG. 12 is a plan view of the one pixel region shown in FIG. 3 as a layout of the organic light emitting display according to a third embodiment of the present invention.

FIG. 12 is a plan view of one pixel region shown in FIG. 3 as a layout of the organic light emitting display according to a third embodiment of the present invention.

Referring to FIG. 12, one pixel region 120 includes red (R), green (G) and blue (B) sub pixel regions. The red (R), green (G) and blue (B) sub pixel regions have different areas from each other. In particular, the blue (B) sub pixel region having relatively lower luminous efficiency is formed over an entire surface of the pixel region 120 in common. The red (R) and green (G) sub pixel regions are formed in a blue (B) closed curve so as not to overlap each other. The red (R) sub pixel region is formed at an upper left portion of the pixel region 120, whereas the green (G) sub pixel region is formed at an upper right portion of the pixel region 120. The red (R), green (G) and blue (B) sub pixels are arranged in a delta pattern having a triangular shape. Although the pixel region 120 of FIG. 12 has a construction similar to that of the pixel region 110 of FIG. 11, respective sub pixels are formed at different locations. Each of the red (R), green (G) and blue (B) sub pixel regions has a square shape, and the blue (B) sub pixel region is formed at a peripheral portion of the pixel region 120.

The blue (B) sub pixel formed on the pixel region 120 may be formed at an upper portion or a lower portion of the red (R) and green (G) sub pixels. When the blue (B) sub pixel is formed at the upper portion thereof, the red (R) and green (G) sub pixel regions are divided from each other by a pixel definition film 121.

Figure 13:
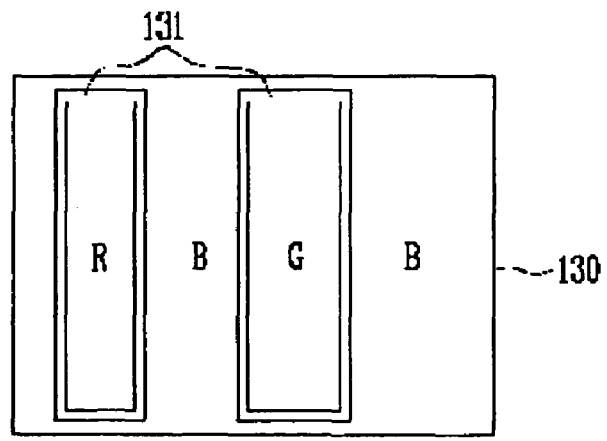
FIG. 13 is a plan view of the one pixel region shown in FIG. 3 as a layout of the organic light emitting display according to a fourth embodiment of the present invention.

FIG. 13 is a plan view of one pixel region shown in FIG. 3 as a layout of the organic light emitting display according to a fourth embodiment of the present invention.

Referring to FIG. 13, one pixel region 130 includes red (R), green (G) and blue (B) sub pixel regions. The red (R), green (G) and blue (B) sub pixel regions have different areas from each other. In particular, the blue (B) sub pixel region having relatively lower luminous efficiency is formed over an entire surface of the pixel region 130 in common. The red (R) and green (G) sub pixel regions are formed in a blue (B) closed curve so as not to overlap each other. The red (R) sub pixel region and the green (G) sub pixel region are formed at left and right sides, respectively, of the pixel region 130. The red (R), green (G) and blue (B) sub pixels are arranged in a stripe pattern having a triangular shape. Each of the red (R), green (G) and blue (B) sub pixel regions has a square shape, and the blue (B) sub pixel region is formed at a peripheral portion of the pixel region 130.

The blue (B) sub pixel formed on the pixel region 130 may be formed at an upper portion or a lower portion of the red (R) and green (G) sub pixels. When the blue (B) sub pixel is formed at the upper portion thereof, the red (R) and green (G) sub pixel regions are divided from each other by a pixel definition film 131.

In FIG. 11 thru FIG. 13, a forming area of the blue (B) emission layer, except forming areas of the red (R) and green (G) emission layers, is greater than that of each of the red (R) and green (G) emission layers. In detail, a ratio of the area of the red (R) emission layer to the area of the blue (B) emission layer ranges from 0.2 to 0.5, and a ratio of the area of the green (G) emission layer to the area of the blue (B) emission layer ranges from 0.2 to 0.5.

Accordingly, the blue (B) sub pixel region is formed over an entire surface of the pixel region 121, thereby improving luminous efficiency of the blue (B) emission layer having a low luminous efficiency relative to a similar level of that of the red (R) or green (G) emission layer. This causes an improvement in life span of the organic light emitting display according to the present invention.

Since the present invention uses the blue (B) emission layer as a common layer, it is unnecessary to pattern the blue (B) emission layer region. Accordingly, the number of masks may be reduced. Furthermore, because blue emission materials are coated on an entire surface of a substrate, the degradation of emission materials occurs only to a small degree, so that the present invention obtains a more stable organic light emitting display than the conventional organic light emitting display.

Although the embodiments of the present invention form a blue (B) emission layer as a common layer, other emission layer having low luminous efficiency may be used as the common layer.

As mentioned above, in accordance with the present invention, a layout of respective pixels is changed to increase an area of one sub pixel region having low luminous efficiency in order to improve life span and aperture ratio of the organic light emitting display. In addition, during formation of an emission layer, the number of masks is reduced. Accordingly, the possibility of occurrence of a misalignment is reduced, thereby maximizing resolution, improving yield, and reducing manufacturing cost.

Although a few embodiments of the present invention have been shown and described, it will be appreciated by those skilled in the art that changes may be made in this embodiment without departing from the principles and spirit of the invention, the scope of which is defined in the claims and their equivalents.

What is claimed is:

1. An organic light emitting display device comprising at least one pixel which includes sub pixels having a plurality of colors, said display device further comprising:
   a first sub pixel emission layer formed over an entire surface of a pixel region;
   at least two second sub pixel emission layers formed on said first sub pixel emission layer so as to have a closed curve; and
   an electron blocking layer interposed between said first sub pixel emission layer and said at least two second sub pixel emission layers, and in direct contact with both of said first sub pixel emission layer and said at least two second sub pixel emission layers.

2. The organic light emitting display device as claimed in claim 1, wherein the first sub pixel emission layer is formed so as to have a blue color.

3. The organic light emitting display device as claimed in claim 1, wherein a forming area of said first sub pixel emission layer, not including forming areas of said at least two second sub pixel emission layers, is greater than a forming area of each of said at least two second sub pixel emission layers.

4. The organic light emitting display device as claimed in claim 3, wherein a ratio of an area of any second sub pixel emission layer to an area of the first sub pixel emission layer ranges from 0.2 to 0.5.

5. The organic light emitting display device as claimed in claim 1, wherein the electron blocking layer is formed of $Ir(ppz)_3$.

6. The organic light emitting display device as claimed in claim 1, wherein a luminous efficiency of the first sub pixel emission layer is lower than a luminous efficiency of each of said at least two second sub pixel emission layers.

7. The organic light emitting display device as claimed in claim 1, wherein said at least two second sub pixel emission layers are formed so as to have a red color and a green color, respectively.

8. The organic light emitting display device as claimed in claim 1, wherein said first sub pixel emission layer and said at least two second sub pixel emission layers are arranged in one of a stripe pattern and a delta pattern.

9. The organic light emitting display device as claimed in claim 1, further comprising pixel definition layers formed along peripheral regions of the said at least two second sub pixel emission layers.

10. The organic light emitting display device as claimed in claim 1, wherein any one of said first sub pixel emission layer and said at least two second sub pixel emission layers is formed by one of vacuum deposition, wet coating, ink jet, and thermal transfer.

11. The organic light emitting display device as claimed in claim 1, wherein the electron blocking layer is formed by one of vacuum deposition, wet coating, ink jet, and thermal transfer.

12. An organic light emitting display device comprising at least one pixel which includes sub pixels having a plurality of colors, said at least one pixel comprising:
   a first electrode layer respectively included in said sub pixels and formed on one region of a substrate;
   a first sub pixel emission layer formed over an entire surface of a pixel region;
   a second sub pixel emission layer formed at one region of the first sub pixel emission layer so as to have a closed curve;
   a third sub pixel emission layer formed at another region of the first sub pixel emission layer so as to have a closed curve;
   a second electrode layer formed on the first, second and third sub pixel emission layers, respectively; and
   a hole blocking layer interposed between the first sub pixel emission layer and any of the second and third sub pixel emission layers, and in direct contact with the first sub pixel emission layer and the second and third sub pixel emission layers.

13. The organic light emitting display device as claimed in claim 12, wherein the first sub pixel emission layer is formed so as to have a blue color.

14. The organic light emitting display device as claimed in claim 12, wherein a forming area of the first sub pixel emission layer, not including forming areas of the second and third sub pixel emission layers, is greater than a forming area of each of the second and third sub pixel emission layers.

15. The organic light emitting display device as claimed in claim 14, wherein a ratio of an area of any one of the second and third sub pixel emission layers to an area of the first sub pixel emission layer ranges from 0.2 to 0.5.

16. The organic light emitting display device as claimed in claim 12, wherein a luminous efficiency of the first sub pixel emission layer is lower than a luminous efficiency of each of the second and third sub pixel emission layers.

17. The organic light emitting display device as claimed in claim 12, wherein the second and third sub pixel emission layers are formed so as to have a red color and a green color, respectively.

18. The organic light emitting display device as claimed in claim 12, wherein the first, second and third sub pixel emission layers are arranged in one of a stripe pattern and a delta pattern.

19. The organic light emitting display device as claimed in claim 9, wherein the hole blocking layer is formed of a material selected from the group consisting of BCP, BAlq, SAlq, TAZ, OXD7, $Alq_3$, and PBD.

20. The organic light emitting display device as claimed in claim 12, further comprising pixel definition layers formed along peripheral regions of the second and third sub pixel emission layers.

21. The organic light emitting display device as claimed in claim 12, wherein any one of said first, second and third sub pixel emission layers is formed by one of vacuum deposition, wet coating, ink jet, and thermal transfer.

22. The organic light emitting display device as claimed in claim 12, wherein the electron blocking layer is formed by one of vacuum deposition, wet coating, ink jet, and thermal transfer.

23. In a method for fabricating an organic light emitting display device which includes at least one pixel including sub pixels having a plurality of colors, a method of forming a pixel region of said at least one pixel, comprising the steps of:

forming first electrode layers of the sub pixels on one region of a substrate;

forming a first sub pixel emission layer over an entire surface of the pixel region;

forming a second sub pixel emission layer on one region of the first sub pixel emission layer so as to have a closed curve;

forming a third sub pixel emission layer on another region of the first sub pixel emission layer so as to have a closed curve;

forming second electrode layers on the first and second sub pixel emission layers, respectively; and interposing one of an electron blocking layer and a hole blocking layer between the first sub pixel emission layer and any of the second and third sub pixel emission layers, and the one of the electron blocking layer and a hole blocking layer being in direct contact with the first sub pixel emission layer and the second and third sub pixel emission layers.

24. The method as claimed in claim 23, wherein any one of the first, second and third sub pixel emission layers is formed by one of vacuum deposition, wet coating, ink jet, and a thermal transfer method.

25. The method as claimed in claim 23, wherein the electron blocking layer is formed by one of vacuum deposition, wet coating, ink jet, and a thermal transfer method.

26. The method as claimed in claim 23, wherein the hole blocking layer is formed of a material selected from the group consisting of BCP, BAlq, SAlq, TAZ, OXD7, $Alq_3$, and PBD.

27. The method as claimed in claim 23, wherein a forming area of the first sub pixel emission layer, not including forming areas of the second and third sub pixel emission layers, is greater than a forming area of each of the second and third sub pixel emission layers.

28. The method as claimed in claim 27, wherein a ratio of an area of any one of the second and third sub pixel emission layers to an area of the first sub pixel emission layer ranges from 0.2 to 0.5.

29. The method as claimed in claim 23, wherein the electron blocking layer is formed of $Ir(ppz)_3$.

30. The method as claimed in claim 23, wherein a luminous efficiency of the first sub pixel emission layer is lower than a luminous efficiency of each of the second and third sub pixel emission layers.

31. The method as claimed in claim 23, wherein the second and third sub pixel emission layers are formed so as to have a red color and a green color, respectively.

32. The method as claimed in claim 23, wherein said first, second and third sub pixel emission layers are arranged in one of a stripe pattern and a delta pattern.

33. The method as claimed in claim 23, further comprising forming pixel definition layers along peripheral regions of the second and third sub pixel emission layers.

* * * * *